US012222406B2

(12) United States Patent
Shima et al.

(10) Patent No.: US 12,222,406 B2
(45) Date of Patent: Feb. 11, 2025

(54) INTEGRATED CIRCUIT DEVICE

(71) Applicant: Hitachi Astemo, Ltd., Hitachinaka (JP)

(72) Inventors: Yasuo Shima, Hitachinaka (JP); Keishi Komoriyama, Hitachinaka (JP); Yoichiro Kobayashi, Hitachinaka (JP)

(73) Assignee: Hitachi Astemo, Ltd., Hitachinaka (JP)

( * ) Notice: Subject to any disclaimer, the term of this patent is extended or adjusted under 35 U.S.C. 154(b) by 148 days.

(21) Appl. No.: 18/011,461

(22) PCT Filed: Feb. 5, 2021

(86) PCT No.: PCT/JP2021/004251
§ 371 (c)(1),
(2) Date: Dec. 19, 2022

(87) PCT Pub. No.: WO2021/260991
PCT Pub. Date: Dec. 30, 2021

(65) Prior Publication Data
US 2023/0266405 A1    Aug. 24, 2023

(30) Foreign Application Priority Data
Jun. 22, 2020    (JP) .................... 2020-107204

(51) Int. Cl.
*G01R 31/54*    (2020.01)
(52) U.S. Cl.
CPC .................... *G01R 31/54* (2020.01)
(58) Field of Classification Search
CPC .................................................. G01R 31/54
See application file for complete search history.

(56) References Cited

U.S. PATENT DOCUMENTS 7,100,368 B2 * 9/2006 Ito ........................ F01N 11/00
                                                     60/287
9,874,595 B2 * 1/2018 Kawamura .......... B60L 3/0069
(Continued)

FOREIGN PATENT DOCUMENTS

JP    2009-133815 A    6/2009
JP    2015-136078 A    7/2015
(Continued)

OTHER PUBLICATIONS

International Search Report (PCT/ISA/210) issued in PCT Application No. PCT/JP2021/004251 dated Jun. 1, 2021 with English translation (five (5) pages).
(Continued)

*Primary Examiner* — Reena Aurora
(74) *Attorney, Agent, or Firm* — Crowell & Moring LLP

(57) ABSTRACT

Poor opening is detected with certainty and reliability with respect to a ground line of an integrated circuit device regardless of the connection state of a load and the operating state of a drive circuit. In an integrated circuit device 10, a drive circuit 30 switches between conduction and interruption of a load current using switch elements 40 and 45. The ground line 31 is grounded via the GND terminal 32 to the common ground provided outside the integrated circuit device 10 and is connected to the drive circuit 30. The ground line 21 is grounded to the common ground via the GND terminal 22 and is connected to the control circuit 20. The diagnostic current supply circuit 90 supplies a predetermined diagnostic current to the ground line 31. The rectifying elements 61 and 62 are connected between the ground line 21 and the ground line 31. The diagnostic circuit 70 measures the potential difference between the ground line 31 and the ground line 21 and compares the potential
(Continued)

difference with the predetermined comparison voltage 73 to diagnose the grounding state of the ground line 31.

8 Claims, 7 Drawing Sheets

(56) References Cited

U.S. PATENT DOCUMENTS

| | | | |
|---|---|---|---|
| 10,634,710 B1 * | 4/2020 | Long | G01R 31/66 |
| 10,768,242 B1 * | 9/2020 | Kitchin | H02J 4/00 |
| 2009/0109588 A1 | 4/2009 | Hayama et al. | |

FOREIGN PATENT DOCUMENTS

| | | |
|---|---|---|
| JP | 2019-204985 A | 11/2019 |
| KR | 10-2100861 B1 | 4/2020 |

OTHER PUBLICATIONS

Japanese-language Written Opinion (PCT/ISA/237) issued in PCT Application No. PCT/JP2021/004251 dated Jun. 1, 2021 (three (3) pages).

* cited by examiner

INTEGRATED CIRCUIT DEVICE

TECHNICAL FIELD

The present invention relates to an integrated circuit device.

BACKGROUND ART

Widely used are electronic control devices controlling current supply to loads such as solenoids used in, for example, vehicular automatic transmissions. Such an electronic control device is configured to include a drive circuit turning on and off a switch element receiving power supply from a vehicular battery to control energization and supplying a current to a solenoid and a control circuit generating a reference voltage or an electric signal necessary for controlling the operation of the drive circuit. An integrated circuit (IC) device in which a drive circuit and a control circuit are integrated is known as a device applied to electronic control devices. In implementing an electronic control device controlling a solenoid using an integrated circuit device, a large current flows through a drive circuit ground line, and thus it is necessary to prevent control circuit malfunction or characteristic deterioration attributable to the effect thereof. As a method therefor, a structure is recommended in which a ground line of a drive circuit and a ground line of a control circuit are separated in an integrated circuit device and connected to the ground of the integrated circuit device via different GND terminals.

The ground of the integrated circuit device is a reference potential giving the respective operating points of the drive circuit and the control circuit and is connected to the ground lines of the circuits via separate GND terminals. However, in the event of poor opening in the ground line of each circuit attributable to poor GND terminal connection, ground line disconnection, or any other reason, the potential of the ground line of each circuit fluctuates to cause malfunction or deterioration in circuit characteristics. A large current flows through the ground line of the drive circuit in particular, and thus the potential fluctuation attributable to poor opening has a large impact on the line.

Proposed in the related art in this regard is a method for detecting poor ground line opening in an integrated circuit device controlling current supply to a load. According to the technique disclosed in PTL 1, a voltage shift is provided with respect to each of the potentials of logic and power grounds, large and small voltages are set with respect to a forward voltage Vf of an ESD diode, a comparator performs voltage shift-power ground voltage comparison, and ground opening is determined between the logic and power grounds.

CITATION LIST

Patent Literature

PTL 1: JP 2015-136078 A

SUMMARY OF INVENTION

Technical Problem

The technique described in PTL 1 is to detect poor opening of the power ground by detecting that the potential of the power ground rises to the forward voltage Vf of the ESD diode by the current that flows through the power ground flowing through the logic ground via the ESD diode in a case where the power ground is open. However, in a case where the drive circuit (high-side gate, low-side gate) is stopped, no current flows through the drive circuit, and thus the rise in power ground potential is not stable and a certain and reliable determination result cannot be obtained. In addition, depending on the connection state of the load, the current flowing through the power ground in a case where the power ground is open flows to the load via the drive circuit instead of the logic ground, and thus poor opening cannot be detected. As described above, with the technique of PTL 1, a certain and reliable poor opening detection result is not always obtainable depending on the connection state of the load or the operating state of the drive circuit.

Solution to Problem

An integrated circuit device according to the present invention, which is connected to a load and controls a load current supplied to the load, includes: a drive circuit having a switch element and using the switch element to switch between conduction and interruption of the load current; a control circuit controlling operation of the drive circuit; a first ground line grounded to a common ground provided outside the integrated circuit device via a first ground connection terminal and connected to the drive circuit; a second ground line grounded to the common ground via a second ground connection terminal and connected to the control circuit; a diagnostic current supply circuit supplying a predetermined diagnostic current to the first ground line; a bidirectional rectifying element connected between the first ground line and the second ground line; and a diagnostic circuit measuring a potential difference between the first ground line and the second ground line and comparing the potential difference with a predetermined comparison voltage to diagnose a grounding state of the first ground line.

Advantageous Effects of Invention

According to the present invention, regardless of the connection state of the load and the operating state of the drive circuit, poor opening can be detected with certainty and reliability with respect to the ground line of the integrated circuit device.

DESCRIPTION OF EMBODIMENTS

Figure 1:
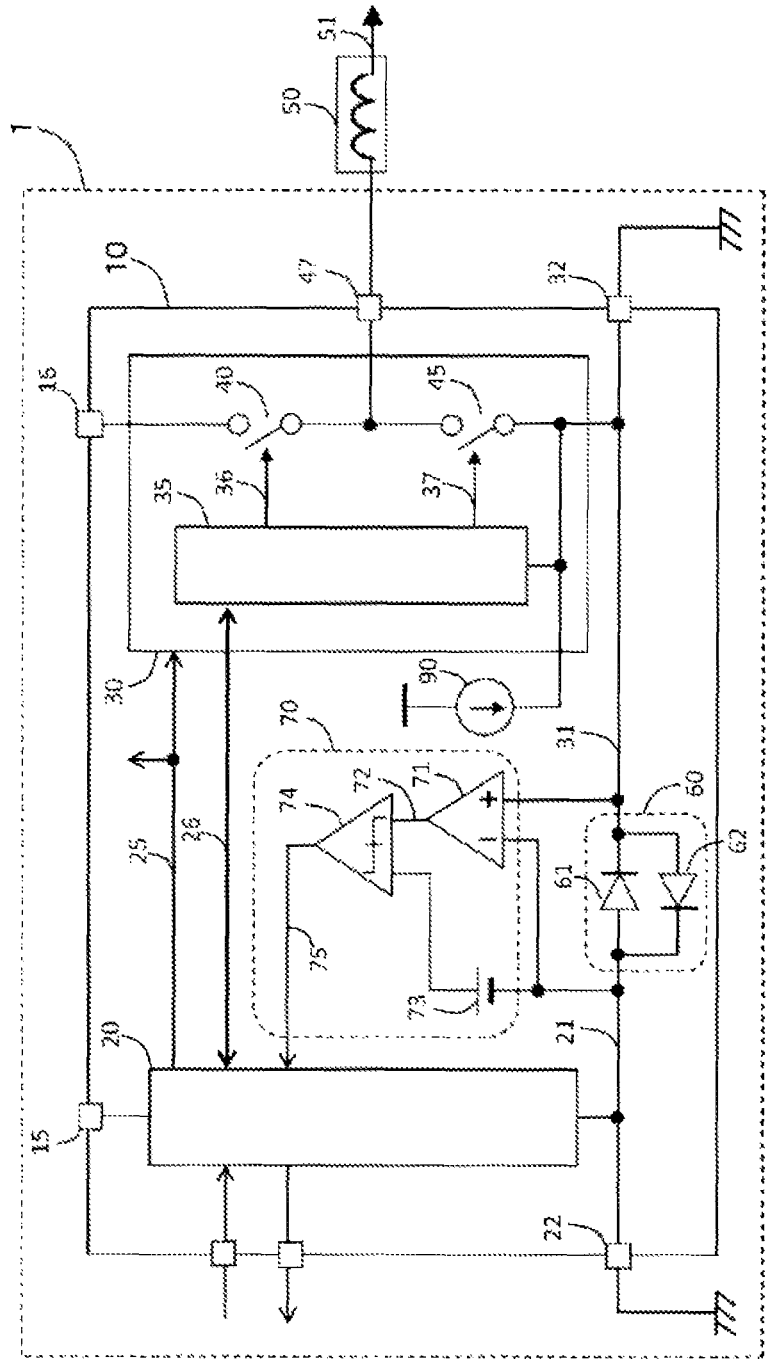
FIG. 1 is a configuration diagram of an integrated circuit device according to a first embodiment of the present invention.

Hereinafter, embodiments of the present invention will be described with reference to the drawings. It should be noted that the drawings are simplified and thus the technical scope of the present invention should not be narrowly interpreted based on the description of the drawings. In addition, the same elements are denoted by the same reference numerals with redundant description omitted.

First Embodiment

A first embodiment of the present invention will be described below with reference to FIGS. 1 to 6.
(Configuration of Integrated Circuit Device)
FIG. 1 is a configuration diagram of an integrated circuit device according to the first embodiment of the present invention. An integrated circuit device 10 according to the present embodiment is provided in an electronic control device 1 mounted in a vehicle system such as an automobile and is connected to a load 50 such as a solenoid to control the load current supplied to the load 50. The load 50 is, for example, a solenoid for operating a vehicular automatic transmission, and the integrated circuit device 10 performs automatic transmission control by controlling the load current flowing through the load 50. The integrated circuit device 10 is configured to include a control circuit 20, a drive circuit 30, a rectifier circuit 60, a diagnostic circuit 70, and a diagnostic current supply circuit 90.

It should be noted that although a plurality of loads are controllable in a general vehicular electronic control device, in the present embodiment, an example in which one load 50 is connected to the integrated circuit device 10 and the load current flowing through this load 50 is controlled by one drive circuit 30 will be described in order to describe the operation of the integrated circuit device 10 in an easy-to-understand manner.

The control circuit 20 generates an operating power supply 25 or a control signal 26 necessary for the operation of the drive circuit 30 and outputs the operating power supply 25 or the control signal 26 to the drive circuit 30. The control circuit 20 is supplied with electric power via a power terminal 15 from a vehicular battery (not illustrated) mounted in the vehicle system and operates using this power supply. The control circuit 20 is connected to a ground line 21, and the ground line 21 is connected via a GND terminal 22 to the common ground of the electronic control device 1 provided outside the integrated circuit device 10. As a result of this connection, the control circuit 20 is grounded via the ground line 21 and the GND terminal 22.

The drive circuit 30 operates in accordance with the control signal 26 from the control circuit 20 using the operating power supply 25 supplied from the control circuit 20. The drive circuit 30 has a high-side switch element 40 and a low-side switch element 45 connected in series between a power terminal 16 and a GND terminal 32 and uses these switch elements to switch between the conduction and interruption of the load current supplied from the vehicular battery (not illustrated) to the load 50 and switch the conduction path. Turning on the high-side switch element 40 and off the low-side switch element 45 leads to low-loss conduction between the power terminal 16 and a LOAD output 47 connected to the load 50, and turning on the low-side switch element 45 and off the high-side switch element 40 leads to low-loss conduction between the GND terminal 32 and the LOAD output 47. As a result, it is possible to switch between the conduction and interruption of the load current flowing through the load 50 and switch the conduction path of the load current.

The drive circuit 30 has a switch element control circuit 35. The switch element control circuit 35 outputs switch control signals 36 and 37 to the high-side switch element 40 and the low-side switch element 45 in accordance with the control signal 26 from the control circuit 20, respectively. As a result, each of the high-side switch element 40 and the low-side switch element 45 can be switched to the ON state or the OFF state and the load current can be controlled as described above.

The drive circuit 30 is connected to a ground line 31, and the ground line 31 is connected via the GND terminal 32 to the common ground of the electronic control device 1 provided outside the integrated circuit device 10. As a result of this connection, the drive circuit 30 is grounded via the ground line 31 and the GND terminal 32.

In general, a load controlled by a vehicular electronic control device, such as the load 50, requires ampere-order current supply. In the present embodiment, the ground line 21 of the control circuit 20 and the ground line 31 of the drive circuit 30 are separated in the integrated circuit device 10 in order to prevent the control circuit 20 from deteriorating in performance or malfunctioning due to ground noise generated by this current.

As described above, these ground lines are connected to the common ground of the electronic control device 1 via the mutually different GND terminals 22 and 32, respectively.

The rectifier circuit 60 is connected between the ground line 21 and the ground line 31. In the integrated circuit device 10 of the present embodiment, the rectifier circuit 60 is inserted between the ground lines 21 and 31 from the viewpoint of electrostatic withstand voltage protection between the ground lines 21 and 31 connected to the common ground independently of each other. The rectifier circuit 60 is configured using rectifying elements 61 and 62 such as diodes connected in mutually opposite directions and has a bidirectional rectification function. As a result, in the case of an open (non-conduction) state between one of the ground lines and the common ground and a constant potential difference between the ground lines attributable to poor connection of the GND terminals 22 and 32 or the like, a current is caused to flow from the ground line on the high-potential side to the ground line on the low-potential side via the rectifier circuit 60 and the charge is discharged.

Figure 2:
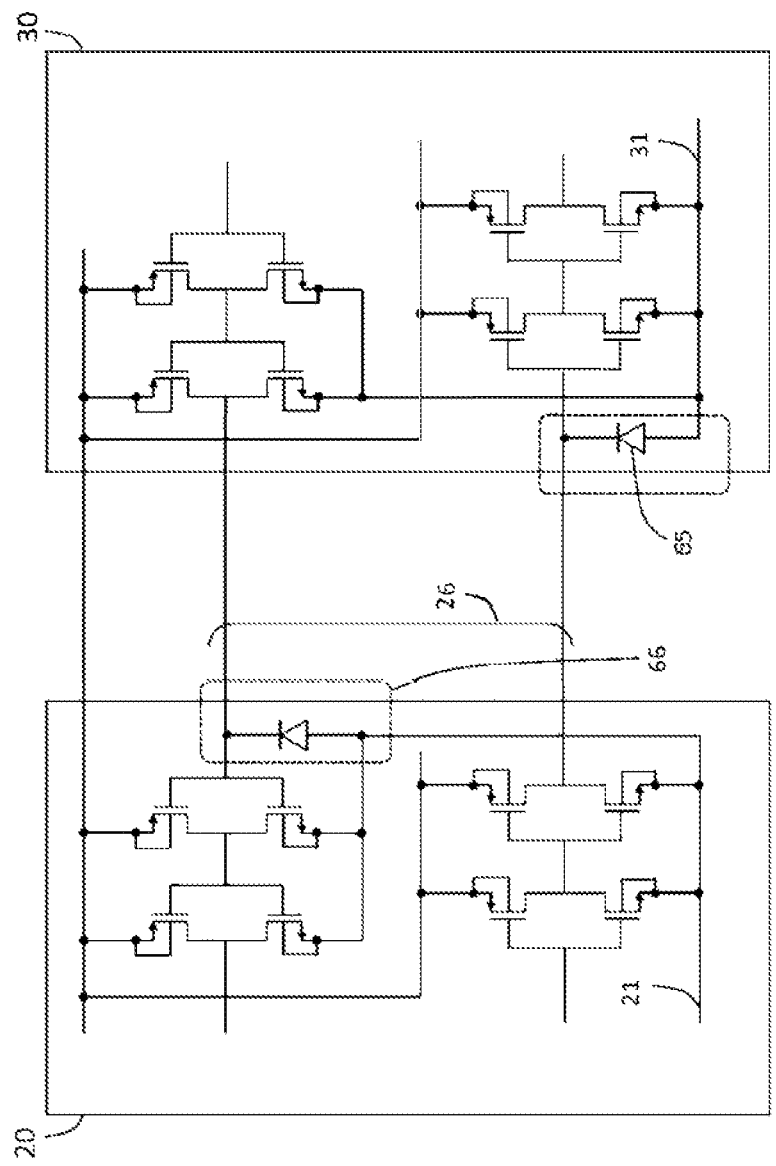
FIG. 2 is a diagram illustrating an example in which a protective diode is disposed on the input side of a control signal.

It should be noted that in order to protect the control circuit 20 or the drive circuit 30 in a case where the potential of the ground line 21 or the ground line 31 has risen due to poor connection of the GND terminals 22 and 32 or the like, a protective diode may be disposed on the input side of the control signal 26 serving as an interface therebetween. FIG. 2 is a diagram illustrating an example in which a protective diode is disposed on the input side of the control signal 26. In the example of FIG. 2, protective diodes 65 and 66 are disposed between the control signal 26 and the ground lines 21 and 31 in the control circuit 20 and the drive circuit 30, respectively.

Here, almost no current flows through the rectifier circuit 60 and the protective diodes 65 and 66 on a normal occasion when the ground lines 21 and 31 and the common ground of the electronic control device 1 are conducted via the GND terminals 22 and 32, respectively. In this case, the current consumed by the control circuit 20 flows from the ground line 21 to the common ground via the GND terminal 22. In addition, the current consumed by the drive circuit 30 flows from the ground line 31 to the common ground via the GND terminal 32.

A load termination 51 on the side opposite to the end of the load 50 to which the LOAD output 47 is connected is connected to either the vehicular battery or the common ground. In a case where the connection destination of the load termination 51 is the vehicular battery, with the drive circuit 30 operating, the current consumption of the switch element control circuit 35 or the load current supplied to the load 50 by switching the low-side switch element 45 to the ON state flows into the ground line 31. On the other hand, in a case where the connection destination of the load termination 51 is the common ground, with the drive circuit 30 operating, the current consumption of the switch element control circuit 35 flows into the ground line 31 by switching the high-side switch element 40 to the OFF state. In these states, when the connection between the ground line 31 and the common ground is interrupted and the ground line 31 is opened due to poor connection of the GND terminal 32 or the like, the current that has flowed into the ground line 31 does not flow out to the common ground via the GND terminal 32 and the potential of the ground line 31 rises. As a result, a forward bias is applied to the rectifying element 62 in the direction from the ground line 31 toward the ground line 21. The rectifying element 62 causes a current corresponding to this forward voltage to flow from the ground line 31 to the ground line 21 and discharges the current to the common ground of the electronic control device 1 via the GND terminal 22. In other words, the rectifying element 62 works so as to generate a voltage such that a current flows from the ground line 31 to the ground line 21 and generate a potential difference between the ground line 31 and the ground line 21.

Therefore, the diagnostic circuit 70 diagnoses the grounding state of the ground line 31 by measuring the potential difference between the ground line 31 and the ground line 21 and determining whether or not this potential difference corresponds to the forward voltage generated in the rectifying element 62 described above. The diagnostic circuit 70 is configured using a monitor circuit 71 and a comparative determination circuit 74. The monitor circuit 71 measures the potential difference between the ground line 31 and the ground line 21 and outputs the measurement result as a monitor circuit output 72. The comparative determination circuit 74 compares the monitor circuit output 72 output from the monitor circuit 71 with a predetermined comparison voltage 73 and outputs the comparison result as a diagnostic result 75 regarding the grounding state of the ground line 31. Specifically, when the monitor circuit output 72 is equal to or lower than the comparison voltage 73, it is determined that the grounding state of the ground line 31 is normal and the determination result is output as the diagnostic result 75. On the other hand, when the monitor circuit output 72 is higher than the comparison voltage 73, it is determined that the grounding state of the ground line 31 is abnormal and poor opening attributable to poor connection of the GND terminal 32 or the like has occurred in the ground line 31 and the determination result is output as the diagnostic result 75.

The diagnostic result 75 output from the comparative determination circuit 74 of the diagnostic circuit 70 is input to the control circuit 20. The control circuit 20 records the diagnostic result 75 and outputs the diagnostic result 75 to another device (not illustrated) provided separately from the integrated circuit device 10 in the electronic control device 1 or takes a predetermined safety measure based on the diagnostic result 75. For example, in a case where the diagnostic result 75 indicating that the grounding state of the ground line 31 is abnormal is input, the drive circuit 30 is stopped and the load current supply to the load 50 is interrupted.

Here, it is preferable to set the comparison voltage 73 in the diagnostic circuit 70 to a value larger than the potential difference generated between the ground line 31 and the ground line 21 when the grounding state of the ground line 31 is normal. As mentioned above, the load current supplied from the integrated circuit device 10 to the load 50 may reach the order of amperes. Accordingly, even with the grounding state of the ground line 31 normal, the parasitic impedance between the ground line 31 and the GND terminal 32 and between the GND terminal 32 and the common ground causes the potential of the ground line 31 to rise. For example, at a parasitic impedance of $0.1\Omega$, a potential rise of 200 mV occurs in the ground line 31 with respect to a load current of 2A. The comparison voltage 73 needs to be sufficiently large so as not to erroneously detect this as poor opening. It should be noted that although not particularly illustrated in FIG. 1, a filter circuit or the like may be added in the stage subsequent to the comparative determination circuit 74 in order to remove, for example, spike noise generated in the ground line 31 due to instantaneous current fluctuation or the like or noise generated in the event of control switching.

The diagnostic current supply circuit 90 is connected to the ground line 31 and supplies a predetermined diagnostic current to the ground line 31. In a state where the integrated circuit device 10 does not control the load 50 and the drive circuit 30 is stopped, no current consumption occurs at the switch element control circuit 35, and thus the current flowing into the ground line 31 from the switch element control circuit 35 is 0 or minute. Accordingly, even in a case where the ground line 31 has been opened, a sufficient potential difference does not occur between the ground line 31 and the ground line 21 and poor opening cannot be reliably detected at the diagnostic circuit 70 in some cases. Therefore, in the present embodiment, the diagnostic current supply circuit 90 is provided in the integrated circuit device 10 and a predetermined diagnostic current is supplied from the diagnostic current supply circuit 90 to the ground line 31 so that a sufficient potential difference is generated between the ground line 31 and the ground line 21 regardless of the operating state of the drive circuit 30 in a case where the ground line 31 is open and poor opening can be reliably detected at the diagnostic circuit 70.

Considering damage to the integrated circuit device 10 or another device in the electronic control device 1, it is preferable that poor opening of the ground line 31 can be detected before the integrated circuit device 10 starts controlling the load current supplied to the load 50. In the present embodiment, by installing the diagnostic current supply circuit 90 in the integrated circuit device 10, poor opening can be reliably detected at the diagnostic circuit 70 regardless of the operating state of the drive circuit 30 as described above. Accordingly, there is an advantage that it is possible to ensure that the grounding state of the ground line 31 is normal before the load current flows through the load 50.

(Comparison Voltage)

Next, the comparison voltage 73 in the diagnostic circuit 70 will be described. As described above, when the ground line 31 is opened due to poor connection of the GND terminal 32 or the like, a potential difference corresponding to the forward voltage of the rectifying element 62 is generated between the ground line 31 and the ground line 21. On the other hand, even with the grounding state of the ground line 31 normal, a rise in potential corresponding to the parasitic impedance between the ground line 31 and the GND terminal 32 and between the GND terminal 32 and the common ground occurs in the ground line 31. Accordingly, in order for the diagnostic circuit 70 to accurately detect poor opening of the ground line 31, it is necessary to set the comparison voltage 73 to a value smaller than the forward voltage of the rectifying element 62 and sufficiently larger than the potential rise attributable to the parasitic impedance described above.

Figure 3:
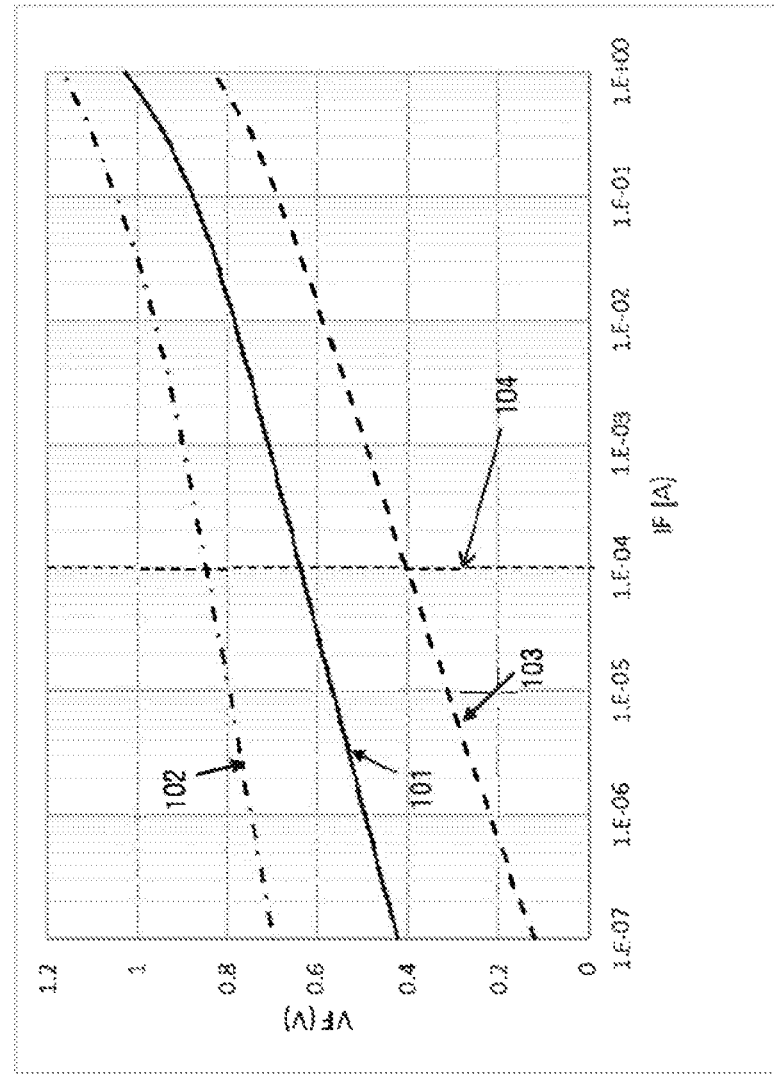
FIG. 3 is a diagram illustrating an example of the electrical characteristics of a rectifying element.

FIG. 3 is a diagram illustrating an example of the electrical characteristics of the rectifying element 62. In FIG. 3, the solid-line graph indicated by reference numeral 101 indicates the relationship between the forward voltage and the forward current of the rectifying element 62 at a standard temperature. Meanwhile, the dashed-line graph indicated by reference numeral 102 indicates the relationship between the forward voltage and the forward current of the rectifying element 62 at a low temperature, and the broken-line graph indicated by reference numeral 103 indicates the relationship between the forward voltage and the forward current of the rectifying element 62 at a high temperature. In these graphs, the horizontal axis represents the forward current value and the vertical axis represents the forward voltage value.

As indicated by the graphs 101 to 103 in FIG. 3, the forward voltage generated in the rectifying element 62 increases as the forward current increases and as the temperature decreases. In other words, the forward voltage of the rectifying element 62 has current dependency and temperature dependency. Accordingly, in view of these relationships, the value of the comparison voltage 73 is set such that the minimum value of the forward voltage generated in the rectifying element 62 exceeds the comparison voltage 73 with respect to the minimum forward current flowing through the rectifying element 62 when the ground line 31 is open.

For example, in a case where the minimum value of the forward current flowing through the rectifying element 62 is 100 μA, the value of the comparison voltage 73 should be set to 0.4 V or less from the intersection of the graph 103 and dotted line 104 in FIG. 3. It can be determined that the ground line 31 is poorly open when the potential difference between the ground line 31 and the ground line 21 measured by the monitor circuit 71 is greater than the set value of the comparison voltage 73.

It can be seen that the presence or absence of poor opening of the ground line 31 can be reliably detected with respect to a forward current and a temperature within predetermined ranges in this manner.

However, even in a case where the same forward current is applied to the rectifying element 62 at the same temperature, an individual difference occurs in the forward voltage generated in the rectifying element 62 due to, for example, a variation in a manufacturing process. Therefore, it is preferable to determine the set value of the comparison voltage 73 in consideration of such an individual difference. For example, a semiconductor element manufactured in the same manufacturing process as the rectifying element 62 is provided in the diagnostic circuit 70 and the comparison voltage 73 is generated by the voltage at the time when the same forward current as the rectifying element 62 is passed through the semiconductor element. By using the comparison voltage 73 generated in this manner, the comparison voltage 73 can be changed in accordance with the temperature of the rectifying element 62 based on the temperature dependency of the forward voltage of the rectifying element 62. As a result, it is possible to realize the diagnostic circuit 70 that is highly tolerant of the individual difference or temperature dependency of the rectifying element 62.

(Diagnostic Current)

Next, the diagnostic current supplied to the ground line 31 by the diagnostic current supply circuit 90 will be described.

In the integrated circuit device 10, in a case where the grounding state of the ground line 31 is normal, the diagnostic current supplied from the diagnostic current supply circuit 90 to the ground line 31 is a wasted current consumption that flows out from the ground line 31 to the common ground of the electronic control device 1 via the GND terminal 32. Accordingly, in a case where the ground line 31 is open, it is preferable that the diagnostic current supply circuit 90 supplies, as a diagnostic current, the minimum current required to generate a potential difference equal to or greater than the comparison voltage 73 between the ground line 31 and the ground line 21.

Here, the current value of the diagnostic current supplied by the diagnostic current supply circuit 90 may be changed in accordance with the operating state of the drive circuit 30 or the implementation status of the opening diagnosis by the diagnostic circuit 70. For example, in a case where the drive circuit 30 is in operation and a potential difference equal to or greater than the comparison voltage 73 can be obtained between the ground line 31 and the ground line 21 by the forward voltage of the rectifying element 62 corresponding to the current consumption thereof, the diagnostic current supply circuit 90 is stopped and the diagnostic current becomes zero. On the other hand, in a case where the operation of the drive circuit 30 is stopped or a potential difference equal to or greater than the comparison voltage 73 cannot be obtained between the ground line 31 and the ground line 21 with the current consumption of the drive circuit 30, a diagnostic current corresponding to the current shortfall is supplied from the diagnostic current supply circuit 90. Further, by stopping the diagnostic current supply circuit 90 when the opening diagnosis is not performed by the diagnostic circuit 70, the diagnostic current is supplied only when the diagnosis is performed. In this manner, further efficiency improvement can be achieved.

(Switch Element)

Next, the configurations of the high-side switch element 40 and the low-side switch element 45 will be described. In general, the high-side switch element 40 and the low-side switch element 45 mounted in the integrated circuit device 10 and used for load current control are configured using MOS transistors.

Figure 4:
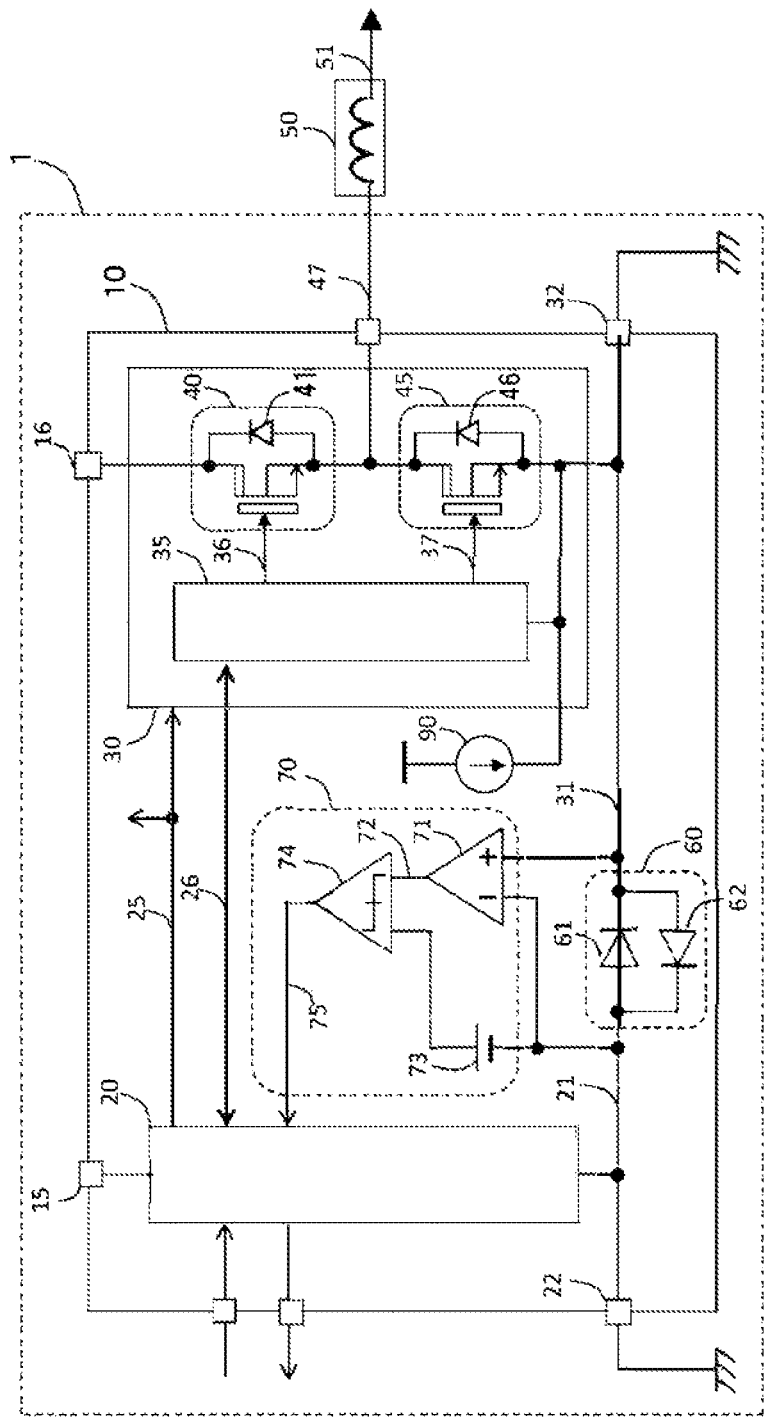
FIG. 4 is a diagram illustrating a configuration example of a switch element.

FIG. 4 is a diagram illustrating a configuration example of a switch element using a MOS transistor. As illustrated in FIG. 4, parasitic diodes 41 and 46 are respectively formed in a direction from the low side to the high side in the high-side switch element 40 and the low-side switch element 45 configured by MOS transistors. It should be noted that in FIG. 4, parts other than the high-side switch element 40 and the low-side switch element 45 are the same as the configuration diagram of the integrated circuit device 10 illustrated in FIG. 1.

By the low-side switch element 45 having the parasitic diode 46, in a case where the connection destination of the load termination 51 is the common ground, even when the low-side switch element 45 is in the OFF state, a current path may be formed that reaches the common ground from the ground line 31 via the parasitic diode 46 and, further, through the LOAD output 47 and the load 50. As for the potential difference generated between the ground line 31 and the ground line 21 at this time, the forward voltage generated by the current flowing through the parasitic diode 46, not the rectifying element 62, becomes dominant.

Therefore, in a case where the load 50 is an inductive load solenoid and the connection destination of the load termination 51 is the common ground, when the diagnostic circuit 70 performs opening diagnosis with the drive circuit 30 stopped, a diagnostic current set in accordance with the forward voltage and current characteristics of the parasitic diode 46 is supplied from the diagnostic current supply circuit 90. As a result, in a case where the grounding state of the ground line 31 is open, the diagnostic circuit 70 is capable of reliably detecting poor opening of the ground line 31 by causing the potential difference generated between the ground line 31 and the ground line 21 by the current flowing through the parasitic diode 46 to become equal to or greater than the comparison voltage 73.

(Method for Detecting Poor Opening in Case Where Load Termination is Connected to Common Ground)

Next, a method for detecting poor opening in a case where the load termination 51 is connected to the common ground will be described with reference to FIG. 5. It should be noted that in the following description, the integrated circuit device 10 has the configuration illustrated in FIG. 4 and the switch element control circuit 35 in the drive circuit 30 repeats the operation of alternately switching the high-side switch element 40 and the low-side switch element 45 to the ON state or the OFF state in a complementary and exclusive manner at a constant cycle in response to the control signal 26 from the control circuit 20. It is also assumed that the load 50 is an inductive load solenoid and the load termination 51 is connected to the common ground.

Figure 5:
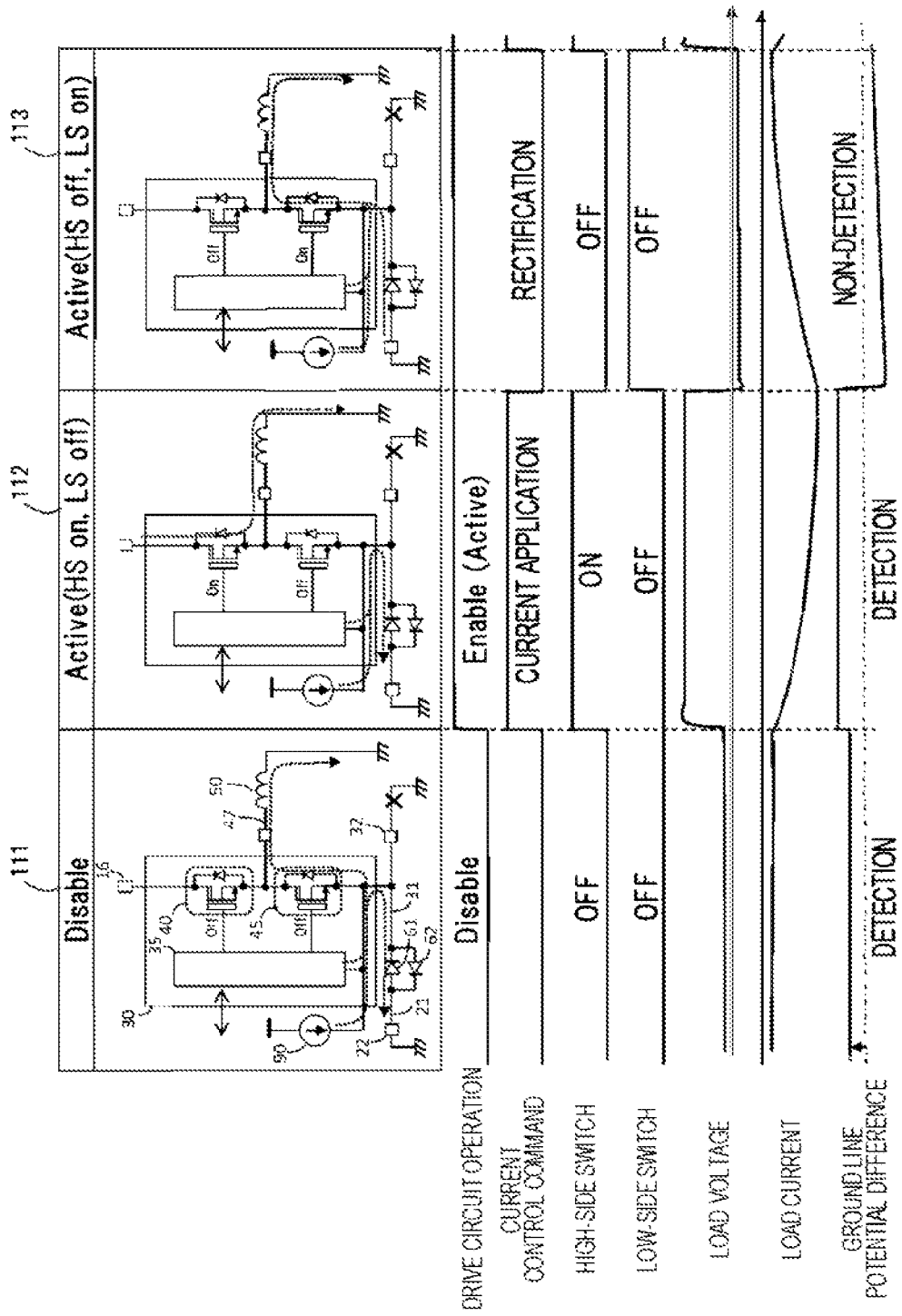
FIG. 5 is an explanatory diagram of a method for detecting poor opening in a case where a load termination is connected to a common ground.

In FIG. 5, reference numeral 111 indicates a state where the integrated circuit device 10 is yet to start controlling the load 50 and the operation of the drive circuit 30 is stopped. In this state, the current consumption of the switch element control circuit 35 is 0 and both the high-side switch element 40 and the low-side switch element 45 are in the OFF state. At this time, the diagnostic current from the diagnostic current supply circuit 90 flows into the ground line 31.

It is assumed that a connection abnormality has occurred between the GND terminal 32 and the common ground and the ground line 31 has been opened in the above state 111. In this case, as indicated by the dotted line in the drawing, the diagnostic current that has flowed into the ground line 31 is divided and flows through the current path that reaches the common ground via the rectifying element 62, the ground line 21, and the GND terminal 22 and the current path that reaches the common ground via the parasitic diode 46 of the low-side switch element 45, the LOAD output 47, and the load 50.

The low-side switch element 45 is larger in size than the rectifying element 62 because it is necessary to conduct a large current of ampere order as a return current of the load 50. Accordingly, when the parasitic diode 46 in the low-side switch element 45 and the rectifying element 62 are compared as to the magnitude of the current flowing with respect to the same forward voltage, the parasitic diode 46 is larger than the rectifying element 62. Accordingly, most of the diagnostic current that has flowed into ground line 31 flows through the current path that reaches the common ground via the parasitic diode 46, the LOAD output 47, and the load 50. The potential difference generated between the ground line 31 and the ground line 21 at this time is approximately equal to the forward voltage of the parasitic diode 46 with respect to the diagnostic current.

When the ground line 31 is opened with the load termination 51 connected to the common ground and the operation of the drive circuit 30 stopped as described above, a potential difference approximately equal to the forward voltage of the parasitic diode 46 corresponding to the diagnostic current is generated between the ground line 31 and the ground line 21. In the diagnostic current supply circuit 90, it is necessary to set the value of the diagnostic current such that the diagnostic circuit 70 is capable of detecting the potential difference as the grounding state abnormality of the ground line 31. For example, a current value at which the forward voltage of the parasitic diode 46 is equal to or greater than the comparison voltage 73 is calculated in advance based on the forward voltage and current characteristics of the parasitic diode 46 and the current value is stored in advance in the diagnostic current supply circuit 90. When the operation of the drive circuit 30 is stopped, the diagnostic current is supplied from the diagnostic current supply circuit 90 to the ground line 31 using this as the set value of the diagnostic current. As a result, in a case where the ground line 31 has been opened, a potential difference equal to or greater than the comparison voltage 73 is generated between the ground line 31 and the ground line 21, and thus poor opening of the ground line 31 can be reliably detected by the diagnostic circuit 70.

In FIG. 5, reference numeral 112 indicates a state where the load 50 is controlled by the integrated circuit device 10 operating the drive circuit 30 and a load current is supplied to the load 50 from the vehicular battery (not illustrated). In this state, by the switch element control circuit 35 switching the high-side switch element 40 from the OFF state to the ON state, the load current is supplied from the vehicular battery (not illustrated) to the load 50 via the power terminal 16, the high-side switch element 40, and the LOAD output 47 as indicated by the dotted line in the drawing. At this time, in addition to the diagnostic current from the diagnostic current supply circuit 90, the current consumption of the switch element control circuit 35 flows into the ground line 31.

It is assumed that a connection abnormality has occurred between the GND terminal 32 and the common ground and the ground line 31 has been opened in the above state 112. In this case, as indicated by the dotted line in the drawing, the current that has flowed into the ground line 31 flows through the current path that reaches the common ground via the rectifying element 62, the ground line 21, and the GND terminal 22. Accordingly, a potential difference corresponding to the forward voltage of the rectifying element 62 with respect to the total value of the diagnostic current and the current consumption of the switch element control circuit 35 is generated between the ground line 31 and the ground line 21.

It should be noted that, in the above state, the high-side switch element 40 is in the ON state and thus the potential of the LOAD output 47 reaches the same level as the power terminal 16. Accordingly, the parasitic diode 46 is not forward-biased by the current flowing into the ground line 31 and no current path is formed from the ground line 31 to the load 50.

When the ground line 31 is opened with the load termination 51 connected to the common ground and the high-side switch element 40 switched to the ON state and the low-side switch element 45 switched to the OFF state during the operation of the drive circuit 30 as described above, a potential difference corresponding to the forward voltage of the rectifying element 62 corresponding to the total value of the diagnostic current and the current consumption of the switch element control circuit 35 is generated between the ground line 31 and the ground line 21. Accordingly, in the diagnostic current supply circuit 90, the value of the diagnostic current should be set such that the diagnostic circuit 70 is capable of detecting the potential difference as the grounding state abnormality of the ground line 31. It should be noted that in a case where a sufficient potential difference can be obtained by the current consumption of the switch element control circuit 35, the diagnostic current may become zero by stopping the diagnostic current supply circuit 90.

In FIG. 5, reference numeral 113 indicates a state where the load 50 is controlled by the integrated circuit device 10 operating the drive circuit 30 and the load current supply from the vehicular battery (not illustrated) to the load 50 is interrupted. In this state, the switch element control circuit 35 switches the high-side switch element 40 from the ON state to the OFF state and switches the low-side switch element 45 from the OFF state to the ON state, and thus the load current supplied from the vehicular battery to the load 50 is interrupted. At this time, since the load 50 is an inductive load, the energy accumulated in the load 50 is released and, as indicated by the dotted line in the drawing, a return current flows from the ground line 31 to the load 50 via the low-side switch element 45 and the LOAD output 47. As a result, the potential of the LOAD output 47 drops.

It should be noted that although not illustrated in FIG. 5, in the event of a state 112-to-state 113 transition, a dead time is provided during which both the high-side switch element 40 and the low-side switch element 45 are switched to the OFF state. During this dead time, a return current flows from the ground line 31 to the load 50 via the parasitic diode 46 of the low-side switch element 45.

It is assumed that a connection abnormality has occurred between the GND terminal 32 and the common ground and the ground line 31 has been opened in the above state 113. In this case, the return path that reaches the ground line 31 from the common ground via the GND terminal 32 is interrupted and the potential of the ground line 31 drops along with the LOAD output 47. As a result, a forward bias from the ground line 21 to the ground line 31 is applied to the rectifying element 61 and a current corresponding to the forward voltage flows through the rectifying element 61. As a result, as indicated by the dotted line in the drawing, a return current flows through the load 50 from the common ground via the GND terminal 22, the ground line 21, the ground line 31, the low-side switch element 45, and the LOAD output 47.

The diagnostic circuit 70 determines that the grounding state of the ground line 31 is abnormal by detecting a rise in the potential of the ground line 31 with respect to the potential of the ground line 21. Here, immediately after a state 112-to-state 113 transition by the high-side switch element 40 being switched off and the low-side switch element 45 being switched on, the potential of the LOAD output 47 drops as described above and thus the potential of the ground line 31 also drops. In addition, in the state 113, the ground line 31 is connected to the common ground via the low-side switch element 45 and the load 50, and thus the potential of the ground line 31 converges to the ground level over time. Accordingly, in the state 113, the diagnostic circuit 70 is incapable of detecting the grounding state abnormality of the ground line 31 even with the ground line 31 open. However, during the load current control by the integrated circuit device 10, the state 112 and the state 113 appear alternately by each of the high-side switch element 40 and the low-side switch element 45 being periodically switched on and off. Accordingly, the grounding state abnormality of the ground line 31 can be detected in the state 112 and no operational problems arise.

(Method for Detecting Poor Opening in Case Where Load Termination is Connected to Vehicular Battery)

Next, a method for detecting poor opening in a case where the load termination 51 is connected to the vehicular battery (not illustrated) will be described with reference to FIG. 6. It should be noted that in the following description, as in the case of FIG. 5, the integrated circuit device 10 has the configuration illustrated in FIG. 4 and the switch element control circuit 35 in the drive circuit 30 repeats the operation of alternately switching the high-side switch element 40 and the low-side switch element 45 to the ON state or the OFF state in a complementary manner at a constant cycle in response to the control signal 26 from the control circuit 20. It is also assumed that the load 50 is an inductive load solenoid and the load termination 51 is connected to the vehicular battery (not illustrated).

Figure 6:
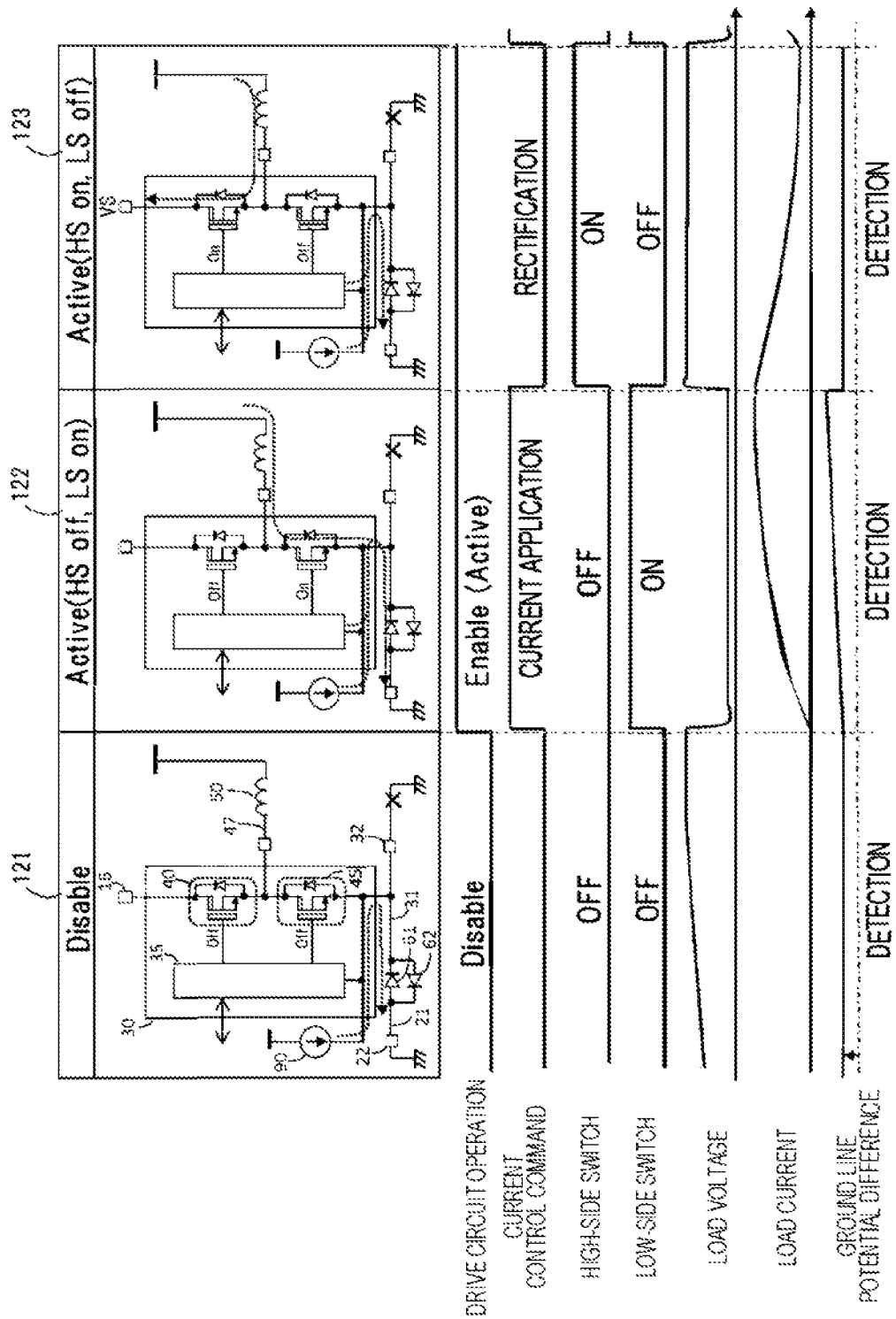
FIG. 6 is an explanatory diagram of a method for detecting poor opening in a case where the load termination is connected to a vehicular battery.

In FIG. 6, reference numeral 121 indicates a state where the integrated circuit device 10 is yet to start controlling the load 50 and the operation of the drive circuit 30 is stopped. In this state, the current consumption of the switch element control circuit 35 is 0 and both the high-side switch element 40 and the low-side switch element 45 are in the OFF state. At this time, the diagnostic current from the diagnostic current supply circuit 90 flows into the ground line 31.

It is assumed that a connection abnormality has occurred between the GND terminal 32 and the common ground and the ground line 31 has been opened in the above state 121. In this case, as indicated by the dotted line in the drawing, the diagnostic current that has flowed into the ground line 31 flows through the current path that reaches the common ground via the rectifying element 62, the ground line 21, and the GND terminal 22. Accordingly, a potential difference corresponding to the forward voltage of the rectifying element 62 with respect to the diagnostic current is generated between the ground line 31 and the ground line 21. Accordingly, in the diagnostic current supply circuit 90, the value of the diagnostic current should be set such that the diagnostic circuit 70 is capable of detecting the potential difference as the grounding state abnormality of the ground line 31. It should be noted that the value of the diagnostic current at this time can be made smaller than the diagnostic current required in the state 111 in FIG. 5.

In FIG. 6, reference numeral 122 indicates a state where the load 50 is controlled by the integrated circuit device 10 operating the drive circuit 30 and a load current is supplied to the load 50 from the vehicular battery (not illustrated). In this state, by the switch element control circuit 35 switching the low-side switch element 45 from the OFF state to the ON state, the load current supplied from the vehicular battery (not illustrated) to the load 50 flows into the ground line 31 via the LOAD output 47 and the low-side switch element 45. In addition, the diagnostic current from the diagnostic current supply circuit 90 and the current consumption of the switch element control circuit 35 also flow into the ground line 31.

It is assumed that a connection abnormality has occurred between the GND terminal 32 and the common ground and the ground line 31 has been opened in the above state 122. In this case, as indicated by the dotted line in the drawing, the current that has flowed into the ground line 31 flows through the current path that reaches the common ground via the rectifying element 62, the ground line 21, and the GND terminal 22. Accordingly, a potential difference corresponding to the forward voltage of the rectifying element 62 with respect to the total value of the load current, the diagnostic current, and the current consumption of the switch element control circuit 35 is generated between the ground line 31 and the ground line 21. Accordingly, in the diagnostic current supply circuit 90, the value of the diagnostic current should be set such that the diagnostic circuit 70 is capable of detecting the potential difference as the grounding state abnormality of the ground line 31. In general, the load current is sufficiently large, and thus the value of the diagnostic current can be zero.

In FIG. 6, reference numeral 123 indicates a state where the load 50 is controlled by the integrated circuit device 10 operating the drive circuit 30 and the load current supply from the vehicular battery (not illustrated) to the load 50 is interrupted. In this state, the switch element control circuit 35 switches the high-side switch element 40 from the OFF state to the ON state and switches the low-side switch element 45 from the ON state to the OFF state, and thus the load current supplied from the vehicular battery to the load 50 is interrupted. At this time, since the load 50 is an inductive load, the energy accumulated in the load 50 is released and, as indicated by the dotted line in the drawing, a return current flows via the high-side switch element 40 and the power terminal 16 between the vehicular battery and the load 50. In addition, the current consumption of the switch element control circuit 35 flows into the ground line 31 in addition to the diagnostic current from the diagnostic current supply circuit 90.

It is assumed that a connection abnormality has occurred between the GND terminal 32 and the common ground and the ground line 31 has been opened in the above state 123. In this case, as indicated by the dotted line in the drawing, the current that has flowed into the ground line 31 flows through the current path that reaches the common ground via the rectifying element 62, the ground line 21, and the GND terminal 22. Accordingly, a potential difference corresponding to the forward voltage of the rectifying element 62 with respect to the total value of the diagnostic current and the current consumption of the switch element control circuit 35 is generated between the ground line 31 and the ground line 21. Accordingly, in the diagnostic current supply circuit 90, the value of the diagnostic current should be set such that the diagnostic circuit 70 is capable of detecting the potential difference as the grounding state abnormality of the ground line 31. In a case where a sufficient potential difference can be obtained by the current consumption of the switch element control circuit 35, the diagnostic current may become zero by stopping the diagnostic current supply circuit 90.

It should be noted that, in the above state, the high-side switch element 40 is in the ON state and thus the potential of the LOAD output 47 reaches the same level as the power terminal 16. Accordingly, the parasitic diode 46 is not forward-biased by the current flowing into the ground line 31 and no current path is formed from the ground line 31 to the load 50.

As described above, in a case where the load termination 51 is connected to the vehicular battery, the potential of the LOAD output 47 does not become lower than the ground line 31 and the parasitic diode 46 is not forward-biased even when the drive circuit 30 is stopped or in operation. As a result, when the ground line 31 is opened due to a connection abnormality of the GND terminal 32 or the like, the current flowing into the ground line 31 flows out to the ground line 21 via the rectifying element 62 and is discharged from the GND terminal 22 to the common ground. Accordingly, when the current flowing into the ground line 31 is ensured by the diagnostic current supplied by the diagnostic current supply circuit 90, opening detection is possible at the diagnostic circuit 70 regardless of the operating state of the drive circuit 30.

According to the first embodiment of the present invention described above, regardless of the connection destination of the load termination 51 or the operating state of the drive circuit 30, it is possible to diagnose the grounding state of the ground line 31 with certainty and reliability by a simpler method and poor opening can be detected. As a result, an abnormality can be detected early, and thus it is possible to suppress the operation period of the integrated circuit device 10 in a large-loss abnormal state and prevent damage to the integrated circuit device 10 mounted in the electronic control device 1 and other devices.

According to the first embodiment of the present invention described above, the following actions and effects are obtained.

(1) The integrated circuit device 10 is connected to the load 50 and controls the load current supplied to the load 50. The integrated circuit device 10 includes the drive circuit 30, the control circuit 20 controlling the operation of the drive circuit 30, the ground lines 21 and 31, the diagnostic current supply circuit 90, the bidirectional rectifying elements 61 and 62, and the diagnostic circuit 70. The drive circuit 30 has the switch elements 40 and 45 and uses the switch elements 40 and 45 to switch between the conduction and interruption of the load current. The ground line 31 is grounded via the GND terminal 32 to the common ground provided outside the integrated circuit device 10 and is connected to the drive circuit 30. The ground line 21 is grounded to the common ground via the GND terminal 22 and is connected to the control circuit 20. The diagnostic current supply circuit 90 supplies a predetermined diagnostic current to the ground line 31. The rectifying elements 61 and 62 are connected between the ground line 21 and the ground line 31. The diagnostic circuit 70 measures the potential difference between the ground line 31 and the ground line 21 and compares the potential difference with the predetermined comparison voltage 73 to diagnose the grounding state of the ground line 31. In this manner, regardless of the connection state of the load 50 and the operating state of the drive circuit 30, poor opening can be detected with certainty and reliability with respect to the ground line 31 of the integrated circuit device 10.

(2) The switch elements of the drive circuit 30 include the high-side switch element 40 and the low-side switch element 45, and each of the switch elements can be switched to the ON state or the OFF state. The drive circuit 30 uses the high-side switch element 40 to conduct or interrupt the load current between the vehicular battery supplying the load current and the load 50 and uses the low-side switch element 45 to conduct or interrupt the load current between the ground line 31 and the load 50. The control circuit 20 repeatedly performs control with respect to the drive circuit 30 to alternately and complementarily switch the high-side switch element 40 and the low-side switch element 45 to the ON state or the OFF state. In this manner, the integrated circuit device 10 is capable of appropriately controlling the load current flowing through the load 50.

(3) The high-side switch element 40 and the low-side switch element 45 are configured using, for example, MOS transistors. In this manner, the high-side switch element 40 and the low-side switch element 45 used in controlling the load current flowing through the load 50 can be easily realized at a reasonable cost.

(4) The diagnostic current supply circuit 90 is capable of changing the diagnostic current in accordance with the operating state of the drive circuit 30. In this manner, wasteful current consumption can be reduced and efficiency can be improved.

(5) The diagnostic circuit 70 is capable of changing the comparison voltage in accordance with the temperature of the rectifying element 62 based on the temperature dependency of the forward voltage of the rectifying element 62. In this manner, the grounding state of the ground line 31 can be accurately diagnosed even with respect to temperature fluctuations.

(6) The control circuit 20 may stop the operation of the drive circuit 30 in a case where the diagnostic circuit 70 has diagnosed that the grounding state of the ground line 31 is abnormal. In this manner, safety can be ensured in a case where the ground line 31 has been opened due to poor connection of the GND terminal 32 or the like.

Second Embodiment

A second embodiment of the present invention will be described below with reference to FIG. 7.

Figure 7:
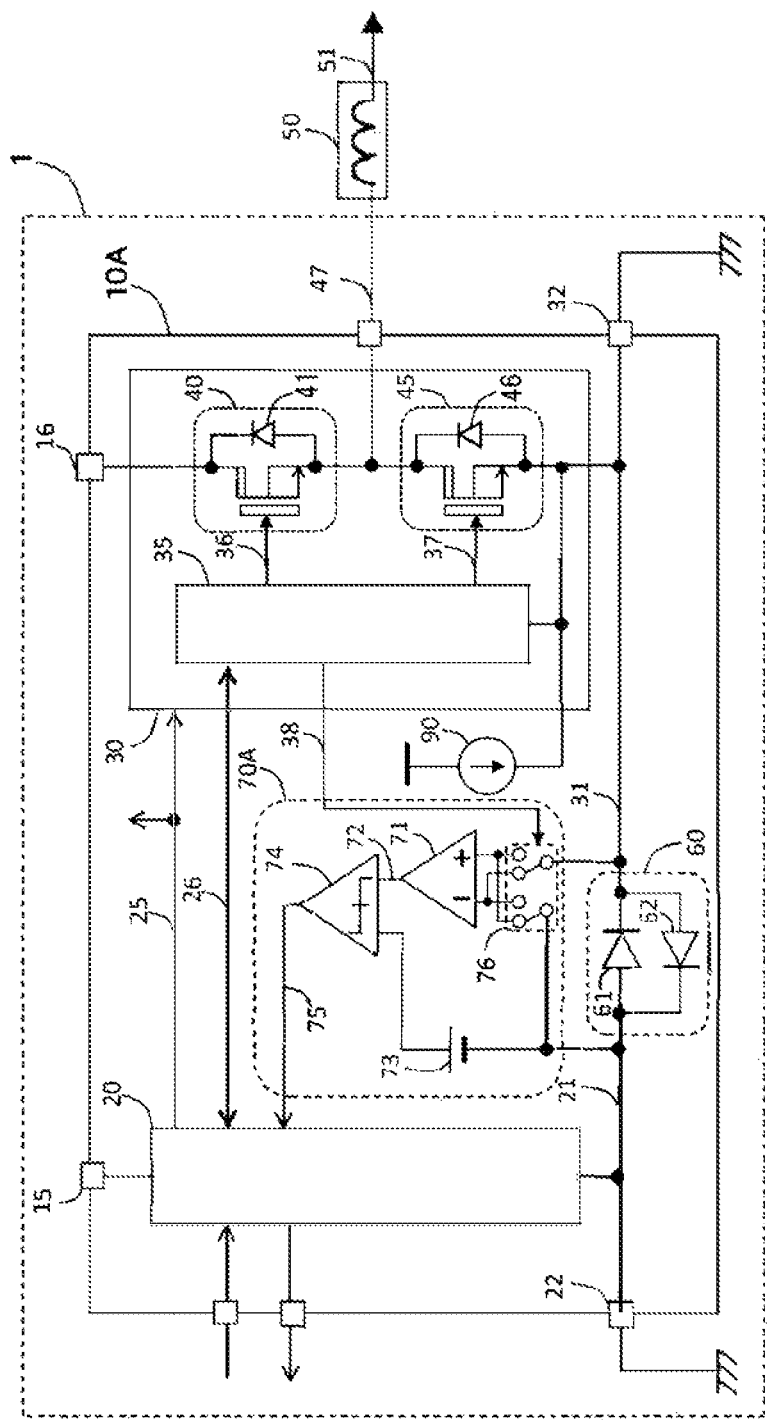
FIG. 7 is a configuration diagram of an integrated circuit device according to a second embodiment of the present invention.

FIG. 7 is a configuration diagram of an integrated circuit device according to the second embodiment of the present invention. As in the case of the integrated circuit device 10 described in the first embodiment, an integrated circuit device 10A according to the present embodiment is provided in the electronic control device 1 mounted in a vehicle system such as an automobile, is connected to the load 50 such as a solenoid, and controls a load current supplied to the load 50.

The integrated circuit device 10A of the present embodiment is provided with a diagnostic circuit 70A instead of the diagnostic circuit 70 of the integrated circuit device 10 described in the first embodiment. The diagnostic circuit 70A has the same configuration as the diagnostic circuit 70 except that an input polarity switching unit 76 is provided on the input side of the monitor circuit 71.

The input polarity switching unit 76 switches the polarity of the voltage input to the monitor circuit 71 based on a switching state signal 38 output from the switch element control circuit 35. The switching state signal 38 indicates the switching state of the high-side switch element 40 and the low-side switch element 45. Specifically, in a case where the load termination 51 is connected to the common ground, the input polarity switching unit 76 switches the polarity of the input voltage to the monitor circuit 71 when the high-side switch element 40 has been switched off and the low-side switch element 45 has been switched on. As a result, in the state 113 of FIG. 5 described in the first embodiment, in a case where a connection abnormality has occurred between the GND terminal 32 and the common ground and the ground line 31 has been opened, the potential difference generated between the ground line 21 and the ground line 31 in accordance with the forward voltage generated in the rectifying element 61 can be detected by the monitor circuit 71 and compared with the comparison voltage 73.

As described above, according to the second embodiment of the present invention, the load 50 is connected between the drive circuit 30 and the common ground, and the diagnostic circuit 70A inverts the polarity of the potential difference between the ground line 31 and the ground line 21 and performs comparison with the comparison voltage 73 when the high-side switch element 40 has been switched from the ON state to the OFF state. As a result, the grounding state of the ground line 31 can be diagnosed even with the load termination 51 connected to the common ground, the load current supply from the vehicular battery to the load 50 interrupted, and a return current flowing through the load 50.

It should be noted that although the drive circuit 30 and the load 50 in each of the embodiments described above have been described as one representative example in order to describe the present invention in an easy-to-understand manner, a plurality thereof may be provided. Regardless of the numbers of drive circuits 30 and loads 50, the present invention can be applied with each having the same configuration. In addition, the control and signal lines illustrated in each embodiment are those considered to be necessary for description, and not all control and signal lines are necessarily shown on the product.

The embodiments and various modification examples described above are merely examples, and the present invention is not limited to the content thereof insofar as the features of the invention are not impaired. In addition, although various embodiments and modification examples have been described above, the present invention is not limited to the content thereof. Other aspects conceivable within the scope of the technical idea of the present invention are also included in the scope of the present invention.

REFERENCE SIGNS LIST 1 electronic control device
10, 10A integrated circuit device
15, 16 power terminal
20 control circuit
21 ground line
22 GND terminal
30 drive circuit
31 ground line
32 GND terminal
35 switch element control circuit
40 high-side switch element
41 parasitic diode
45 low-side switch element
46 parasitic diode
47 LOAD output
50 load
51 load termination
60 rectifier circuit
61, 62 rectifying element
65, 66 protective diode
70, 70A diagnostic circuit
71 monitor circuit
72 monitor circuit output
73 comparison voltage
74 comparative determination circuit
75 diagnostic result
76 input polarity switching unit
90 diagnostic current supply circuit

The invention claimed is:

1. An integrated circuit device connected to a load and controlling a load current supplied to the load, the integrated circuit device comprising:
a drive circuit having a switch element and using the switch element to switch between conduction and interruption of the load current;
a control circuit generating a signal for operation of the drive circuit;
a first ground line grounded to a common ground provided outside the integrated circuit device via a first ground connection terminal and connected to the drive circuit;

a second ground line grounded to the common ground via a second ground connection terminal and connected to the control circuit;

a diagnostic current supply circuit supplying a predetermined diagnostic current to the first ground line;

a bidirectional rectifying element connected between the first ground line and the second ground line; and a diagnostic circuit measuring a potential difference between the first ground line and the second ground line and comparing the potential difference with a predetermined comparison voltage to diagnose a grounding state of the first ground line.

2. The integrated circuit device according to claim 1, wherein the switch element includes a high-side switch element and a low-side switch element each switchable to an ON state or an OFF state, the drive circuit uses the high-side switch element to conduct or interrupt the load current between a power supply supplying the load current and the load and uses the low-side switch element to conduct or interrupt the load current between the first ground line and the load, and the control circuit repeatedly generates a signal for operation of the drive circuit to alternately and complementarily switch the high-side switch element and the low-side switch element to the ON state or the OFF state.

3. The integrated circuit device according to claim 2, wherein the high-side switch element and the low-side switch element are configured using MOS transistors.

4. The integrated circuit device according to claim 2, wherein the load is an inductive load, the load is connected between the drive circuit and the common ground, and the diagnostic circuit inverts polarity of the potential difference and performs comparison with the comparison voltage when the high-side switch element is switched from the ON state to the OFF state.

5. The integrated circuit device according to claim 1, wherein the diagnostic current supply circuit is configured to modify the diagnostic current based on whether the drive circuit is in operation.

6. The integrated circuit device according to claim 1, wherein the diagnostic circuit changes the comparison voltage in accordance with a temperature of the rectifying element based on a temperature dependency of a forward voltage of the rectifying element.

7. The integrated circuit device according to claim 1, wherein the control circuit stops the operation of the drive circuit in a case where the diagnostic circuit diagnoses that the grounding state of the first ground line is abnormal.

8. The integrated circuit device according to claim 1, wherein the load is a solenoid for operating a vehicular automatic transmission, and the automatic transmission is controlled by controlling the load current flowing through the solenoid.

* * * * *